United States Patent
Bauer et al.

(10) Patent No.: US 7,999,636 B2
(45) Date of Patent: Aug. 16, 2011

(54) DMS-FILTER WITH CONNECTED RESONATORS

(75) Inventors: Thomas Bauer, Munich (DE); Franz Kubat, Munich (DE)

(73) Assignee: EPCOS AG, Munich (DE)

(*) Notice: Subject to any disclaimer, the term of this patent is extended or adjusted under 35 U.S.C. 154(b) by 228 days.

(21) Appl. No.: 12/281,887

(22) PCT Filed: Mar. 8, 2007

(86) PCT No.: PCT/DE2007/000429
§ 371 (c)(1),
(2), (4) Date: Oct. 31, 2008

(87) PCT Pub. No.: WO2007/104283
PCT Pub. Date: Sep. 20, 2007

(65) Prior Publication Data
US 2009/0051457 A1 Feb. 26, 2009

(30) Foreign Application Priority Data
Mar. 8, 2006 (DE) .......................... 10 2006 010 752

(51) Int. Cl.
*H03H 9/64* (2006.01)
(52) U.S. Cl. ........................................ 333/193; 333/195
(58) Field of Classification Search .......... 333/193–196; 310/313 B, 313 D
See application file for complete search history.

(56) References Cited

U.S. PATENT DOCUMENTS

| | | | |
|---|---|---|---|
| 5,694,096 A | 12/1997 | Ushiroku et al. | |
| 5,717,367 A * | 2/1998 | Murai | 333/195 |
| 5,770,985 A | 6/1998 | Ushiroku et al. | |
| 5,864,262 A * | 1/1999 | Ikada | 333/193 |
| 6,081,172 A * | 6/2000 | Strauss et al. | 333/193 |
| 6,700,460 B2 | 3/2004 | Takamine | |
| 6,771,144 B2 * | 8/2004 | Takamine | 333/133 |
| 6,919,781 B2 * | 7/2005 | Baier et al. | 333/195 |
| 6,940,368 B2 * | 9/2005 | Plessky et al. | 333/193 |
| 6,967,427 B2 * | 11/2005 | Yata | 310/313 D |
| 7,116,189 B2 | 10/2006 | Takamine | |
| 7,304,553 B2 | 12/2007 | Bauer et al. | |
| 2003/0160665 A1 | 8/2003 | Hagn et al. | |
| 2007/0279157 A1 | 12/2007 | Bauer | |
| 2009/0289745 A1 * | 11/2009 | Bauer et al. | 333/195 |

FOREIGN PATENT DOCUMENTS
DE        198 18 038        11/1999
(Continued)

OTHER PUBLICATIONS

English language machine translation of JP 2004-096349 published Mar. 25, 2004.*

(Continued)

*Primary Examiner* — Barbara Summons
(74) *Attorney, Agent, or Firm* — Fish & Richardson P.C.

(57) ABSTRACT

A surface acoustic wave filter arrangement is described herein. The surface acoustic wave filter arrangement includes a first gate configured to operate symmetrically or asymmetrically, and a second gate configured to operate symmetrically. The filter arrangement also includes a double-mode surface acoustic wave (DMS) filter structure including an input connected to the first gate, and an output. The output includes a terminal pair that includes two symmetrical terminals configured to operate symmetrically. Each of the two symmetrical terminals of the terminal pair is electrically connected at the output of the DMS filter structure to a cascaded resonator.

14 Claims, 8 Drawing Sheets

FOREIGN PATENT DOCUMENTS

| | | |
|---|---|---|
| DE | 100 13 861 | 9/2001 |
| DE | 103 43 296 | 4/2004 |
| DE | 102004020183 | 11/2005 |
| EP | 1 341 304 | 9/2003 |
| JP | 2000-349589 | * 12/2000 |
| JP | 2004-096349 | * 3/2004 |
| WO | WO 03/081773 | 10/2003 |
| WO | WO 2005/107065 | 11/2005 |

OTHER PUBLICATIONS

English language machine translation of JP 2000-349589 published Dec. 15, 2000.*
International Search Report for PCT/DE2007/000429.
Written opinion for PCT/DE2007/000429.
English translation of Written Opinion for PCT/DE2007/000429.

* cited by examiner

DMS-FILTER WITH CONNECTED RESONATORS

CROSS REFERENCE TO RELATED APPLICATIONS

Pursuant to 35 USC §120, this application claims the benefit PCT/DE2007/000429 filed Mar. 8, 2007 which claims the benefit of German Patent Application No. 102006010752.7 filed Mar. 8, 2006. Each of these applications is incorporated by reference in its entirety.

BACKGROUND

For improving the selectivity of bandpass filters in SAW technology, it is known to interconnect DMS filters in parallel or in series with reactance elements in the form of resonators. For SAW filters, it is provided to realize these resonators on the same chip as SAW resonators in a single-gate or double-gate construction.

From U.S. Pat. No. 5,694,096 A, a two-sided, asymmetrically operated DMS filter is known, which is interconnected on the input side and output side in series with a single-gate resonator. From U.S. Pat. No. 5,770,985 A, it is known to interconnect a DMS filter with both a series and also with a parallel single-gate resonator. From WO2005/107065A it is known to interconnect an output-side, symmetrically operated DMS filter in series with an acoustic double-gate resonator.

For optimizing a filter arrangement that has a DMS filter and thus resonators interconnected in series or parallel, resonators with low capacitances can be necessary because they have particularly strongly impressed pole positions. For resonators with low capacitance, however, the problem appears that they are often realized only with low finger counts and/or small apertures. However, small apertures with a size of less than 20λ, expressed as a multiple of the average wavelength λ, increase transverse losses. On the other hand, resonators with less than 100 electrode fingers have increased reflector losses and thus generate increased total losses of the filter arrangement and also lead to undesired resonance peaks in the passband.

SUMMARY

Therefore, the task of the present invention is to specify a filter arrangement of a DMS filter interconnected with resonators, which has low losses and minimizes undesired resonance peaks in the passband.

This task is achieved with a SAW filter arrangement with the features of Claim 1. Advantageous constructions of the invention emerge from the additional claims.

A filter arrangement will be specified, which is completely constructed in SAW technology and which can be interconnected between a first gate that can be operated symmetrically or asymmetrically and a second gate that can be operated symmetrically and which, consequently, can be operated in a balanced/balanced or single-ended/balanced way. The first gate is connected to a DMS filter structure, which guarantees the main filter function of the filter arrangement and which has a transmission behavior with a passband. If the first gate is operated asymmetrically, then the transformation of an asymmetrical input signal into a symmetrical output signal is performed within the DMS filter structure. The output of the DMS filter structure, which is turned toward the second gate that can be operated symmetrically, has a terminal pair that can be operated symmetrically. Each of these two terminals is interconnected directly to a cascaded resonator, while the resonators are connected, in turn, directly to the second gate.

A cascaded resonator is understood to be resonators connected in series, wherein the degree of cascading corresponds to the number of resonators connected in series. Each resonator of each cascade stage has at least one interdigital converter, which is arranged between two reflector structures. The one or more interdigital converters are connected by means of its two current buses, wherein at least one current bus is of the first cascade stage is connected to the DMS filter structure terminal pair balanced on the output side. The second current bus of the one or more interdigital converters is connected to an interdigital converter of the second cascade stage. Its second current bus is connected to the next cascade stage or, in the case of a double cascade, to a ground terminal or to the second gate. The two resonators at the output can also be connected parallel to the second gate. Then the connection of the second current bus to ground can also be eliminated and only the two current buses of the two second cascade stages are connected to each other.

Each resonator of each cascade stage can have exactly one resonance chamber in which resonance and anti-resonance can be formed. In addition to one interdigital converter, additional interdigital converters or other grating-like electrode structures arranged at a regular pattern can be provided. These can be connected to the filter arrangement but do not have to be.

In a preferred embodiment of the invention, the cascaded resonators are connected in series between the DMS filter structure output-side terminal pair facing the second gate and the second gate. With this arrangement, the top flank being located at the high frequency side of the passband can be improved and, in particular, can have a steeper shape. Here, the anti-resonance of the cascaded resonator connected in series is used to place a pole position directly adjacent to the passband and thus to obtain a steep flank of the passband. The resonance frequency of the resonator is then advantageously selected within the passband.

It is also possible to connect the cascaded resonator or resonators in parallel to the output-side symmetrical terminal pair of the DMS filter structure and in parallel to the second gate. In this case, the first current bus of the one or more interdigital converters of the first cascade stage are connected both to one of the balanced terminals of the DMS filter structure and also to the second gate. The second current bus of the interdigital converter of the last cascade stage then can be connected to a ground terminal.

Because each of the two output-side terminals of the DMS filter structure is connected to a resonator or to the interdigital converter of a resonator and for a parallel arrangement each of these resonators advantageously has a ground-side end, the two terminal current buses, that is, the current buses of the interdigital converter of the last cascade stage pointing outward, are connected to each other. Here it is also possible for this end to be floating, that is, not connected to ground or to another fixed external potential. Due to the symmetrical arrangement, a virtual ground is applied to this connection of the two terminal current buses.

The resonators are advantageously constructed as two-stage cascades, with which, in most cases, the desired effect can be implemented. An n-stage cascade of resonators corresponds to a series circuit of n capacitors. In order to achieve a total effective capacitance $C_g$ in the n-times cascade, the capacitance of each individual resonator of a cascade stage must have, in the section, the n-times capacitance, so that for the average capacitance of the individual resonator $C_e$, $C_e = nC_g$ applies.

Because the capacitance of a resonator is essentially proportional to the product of the aperture and number of fingers of interconnected interdigital converter, an n-times capacitance is obtained through an n-times increase in the number of electrode fingers or an n-times increase in the aperture of the resonator or a combination of the two. If both the number of electrode fingers and also the aperture are increased at the same time, then it is sufficient to increase the product of the aperture and number of electrode fingers by the factor n. Due to the increased capacitances of the individual resonators, the disadvantages described above of a number of electrode fingers that is too small and/or apertures that are too small are avoided.

Because both output-side terminals that are operated symmetrically in the DMS filter structure are each connected to a cascaded resonator, it is possible to construct these two cascaded resonators each as single-gate resonators, which have an interdigital converter between two reflector structures.

It is also possible to realize the two cascaded resonators in a cascaded double-gate resonator, wherein each cascade stage has at least two interdigital converters between two reflector structures. Each of the two interdigital converters here corresponds to one of the resonators, which are connected to one of the balanced terminals of the DMS filter structure. Because both interdigital converters of the double-gate resonator acoustically use the same resonance chamber between the two reflector structures, the electrode finger terminal sequence is constructed in such a way that both interdigital converters are in-phase with the standing wave at resonance. Due to the phase difference of, for example, exactly 180° between the two terminals of the DMS filter structure, this is achieved when the two interdigital converters have a symmetrical behavior relative to a reflection plane that is perpendicular to the acoustic track. Accordingly, the resonance chamber of the double-gate resonator is filled with electrode fingers in a regular pattern, wherein the two terminal electrode fingers pointing toward each other in the two interdigital converters of each cascade stage in the resonator point in the same direction. With an at least two-stage cascade of a double-gate resonator, a space-saving compact arrangement is obtained, which can also be operated with high symmetry and which thus improves or at least does not negatively affect the symmetrical properties of the filter arrangement at the second gate.

The first gate, which can be operated symmetrically or asymmetrically, is connected to a DMS filter structure, which is realized in the form of one or more DMS filter tracks connected in parallel. Here, in each case it is possible to replace each individual DMS filter track by two DMS filter tracks cascaded in series, wherein the selectivity of the filter arrangement is increased. A filter arrangement is interconnected on the input side or on the first gate asymmetrically, when it is connected to a signal terminal and a ground terminal. On the output side, it is connected symmetrically and has two terminals that can be operated in a balanced way, that is, a symmetrical terminal pair, on which symmetrical signals can be applied, which, however, have opposite polarity but advantageously equal amplitude. The phase difference advantageously equals 180°.

If the filter arrangement has two or more, but advantageously an even number of DMS filter tracks, then the two symmetrical terminals of the DMS filter structure are also obtained on asymmetrical outputs of different DMS filter tracks. Each of the two filter tracks can deliver an asymmetrical single-ended signal on the output side. Relative to each other, the DMS filter tracks are then shaped relative to the electrode finger terminal sequence in such a way that the two single-ended signals together can produce a symmetrical signal pair.

However, it is also possible to connect two DMS filter tracks, each with a symmetrical output, to each other, wherein, on the output side, two terminals matching in polarity or phase are connected to each other or switched in parallel.

Resonators connected in parallel to the outputs of the DMS filter structure can be selected according to frequency in such a way that the resonance frequency lies just below the passband. Thus, a steeper bottom flank is obtained.

Preferably, DMS filter structures are used, which have a so-called V-split converter as the middle converter. Such a V-split converter has, on one side, a continuous first current bus and, on the other side, a second current bus divided in the middle. The electrode fingers and the divided current buses are constructed symmetrical to a reflection plane perpendicular to the base surface. This has the result that signals with different phases, in particular, symmetrical signals, can be tapped at the two halves of the divided current bus.

The continuous current bus can be connected to ground or can be operated floating, wherein, in the latter, the potential of this current bus corresponds to a virtual ground in operation. However, better symmetrical properties in terms of symmetry of the outputs are obtained if the common current bus is connected to a ground potential.

In one filter arrangement, whose DMS filter structure comprises a V-split converter, the two halves of the divided current bus point to the gate that can be operated symmetrically and deliver signals that are symmetrical to each other. Each subconverter of the V-split converter can be connected in the DMS filter structure in parallel to one or more interdigital converters that deliver, on the output side, a signal of suitable polarity. A DMS filter structure advantageously has an odd number of interdigital converters that are connected alternately to the input and to one of the outputs of the DMS filter structure. Well-suited are DMS filter tracks with three, five, or seven interdigital converters, of which one can be a V-split converter. The V-split converter, however, can also be replaced by two adjacent interdigital converters connected in series electrically.

High symmetry of the balanced terminals of the DMS filter arrangement is obtained when each current bus of the interdigital converter within the DMS track is connected to a good ground. In one construction of the invention, a ground terminal is eliminated, whereby the outermost electrode fingers of a central interdigital converter formed as a V-split converter are lengthened in such a way that each is connected to the opposite current bus of an adjacent interdigital converter. In this way, it is possible to connect the undivided, continuous current bus of the V-split converter transversely via the acoustic track of the DMS filter track to a current bus of an adjacent converter and via this current bus to ground. If the DMS track has symmetrical outputs, then the ground connection reaches transversely via the track to one side of the V-split converter with one finger, while, on the other side, for reasons of symmetry, a blind finger is inserted, which can consist, in particular, of another lengthened finger connecting the two current buses.

A filter arrangement according to the invention can be realized in three acoustic tracks. The DMS filter structure, particularly an individual DMS filter track, is arranged in a first track. The two other tracks can be assumed by the two cascade stages of a two-times cascaded double-gate resonator. In a preferred construction, these three acoustic tracks are directly adjacent to each other.

However, it is also possible to realize a filter arrangement with more than three acoustic tracks. A three-times and more cascaded resonator can require a third acoustic track. However, it is also possible to realize the cascading of the resonators in such a way that both cascade stages are arranged within an acoustic track. A higher number of acoustic tracks is also provided if the DMS filter structure comprises two DMS filter tracks, which are realized in two acoustic tracks.

It is also possible to spatially separate the different cascade stages of the cascaded resonator so that these are no longer directly adjacent to each other. Advantageously, however, successive cascade stages are directly adjacent and can be constructed, with respect to the filter arrangement, symmetrically with respect to a reflection plane arranged between the two cascade stages in parallel to the acoustic track. It is also possible to realize the two current buses pointing toward each other of two successive cascade stages of the resonator in the form of a common current bus, from which electrode fingers for the two cascade stages extend in two opposite directions.

DESCRIPTION OF THE DRAWINGS

Below, the invention will be described in more detail with reference to embodiments and the associated figures. The figures are constructed schematically and not true to scale, so that neither absolute nor relative dimensional information can be taken from the figures.

DETAILED DESCRIPTION

Figure 1:
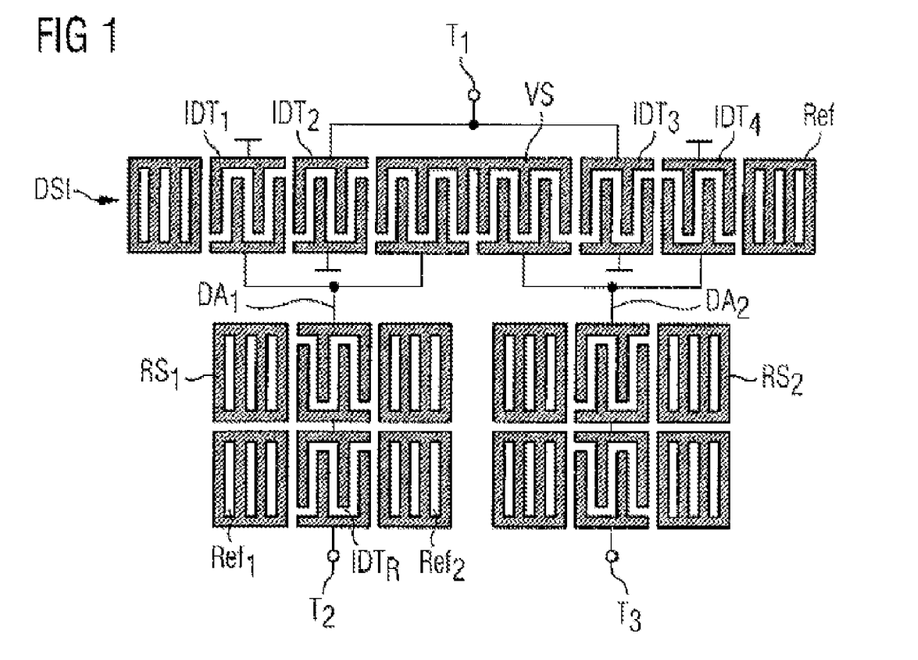
FIG. 1 shows a first filter arrangement with two serial cascaded single-gate resonators.

FIG. 1 shows a first embodiment of the invention, in which a DMS filter DSt has, on the output side, a terminal pair DA1, DA2, which can be operated symmetrically and which are each connected in series to a two-times cascaded single-gate resonator. The filter arrangement is connected between a first asymmetrical gate, which is formed by the signal terminal T1 and the corresponding ground terminals of the DMS structure DSt, and a second symmetrical gate, which is formed by the two symmetrical terminals T2 and T3.

In the DMS structure DSt, five interdigital converters IDT1, IDT2, VS, IDT3, and IDT4 are arranged between two reflectors Ref. The middle V-split converter VS can alternatively also be replaced by two "normal" interdigital converters connected in series. On the output side of the DMS structure (in the figure underneath the DMS structure), the lower current bus of the first interdigital converter IDT1 is connected to the lower current bus of the left sub-converter of the V-split converter VS at a first symmetrical terminal. The second symmetrical terminal DA2 on the output side of the DMS structure DSt is formed by connecting the lower current bus of the right sub-converter of the V-split converter VS and the lower current bus of the fourth interdigital converter IDT4. The terminal T1 of the signal input is connected to the upper current buses of the second and third interdigital converter IDT2 and IDT3. The two two-times cascaded resonators RS1, RS2 connected in series between the symmetrical outputs DA1, DA2 and the terminals T2 and T3 forming the second gate each have the same construction and advantageously have the same resonance frequency, i.e., the electrode fingers of each interdigital converter of the two cascaded single-gate resonators have the same finger spacing (pitch). Likewise, the same finger spacing is given between the two resonators of the two cascade stages of each cascaded resonator. In this way, high symmetry is maintained, which gives a highly symmetrical signal at the second gate.

However, it is also possible to equalize symmetry distortions that may be produced at the symmetrical outputs DA1, DA2 of the DMS filter structure, through corresponding, differently constructed cascaded resonators. The creation of another pole position is possible because the finger spacing between the resonators of different cascade stages of each cascaded resonator is selected to be different.

Figure 2:
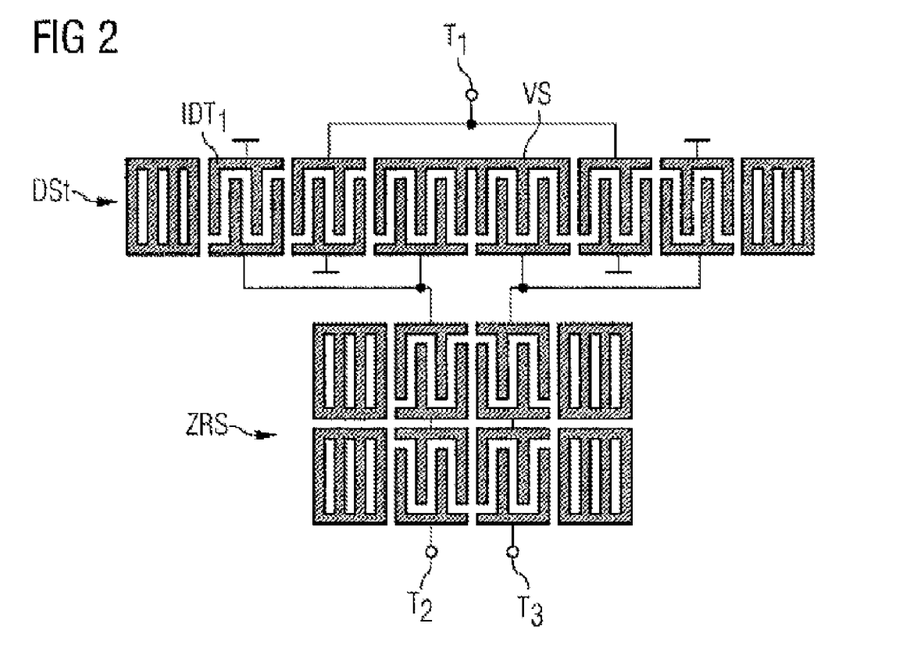
FIG. 2 shows the arrangement in which the single-gate resonators are combined into a double-gate resonator.

FIG. 2 shows a modification of the filter arrangement shown in FIG. 1, in which the two originally separated, two-times cascaded resonators are combined into one cascaded double-gate resonator. The first (upper) gate of the double-gate resonator is connected to the symmetrical terminals of the DMS filter structure DSt. The second gate of the double-gate resonator (shown at the very bottom of the figure) is connected to the second gate of the filter arrangement formed from terminals T2 and T3.

The double-gate resonator ZRS is constructed symmetrically relative to a reflection plane perpendicular to the propagation direction of the surface wave.

Figure 3:
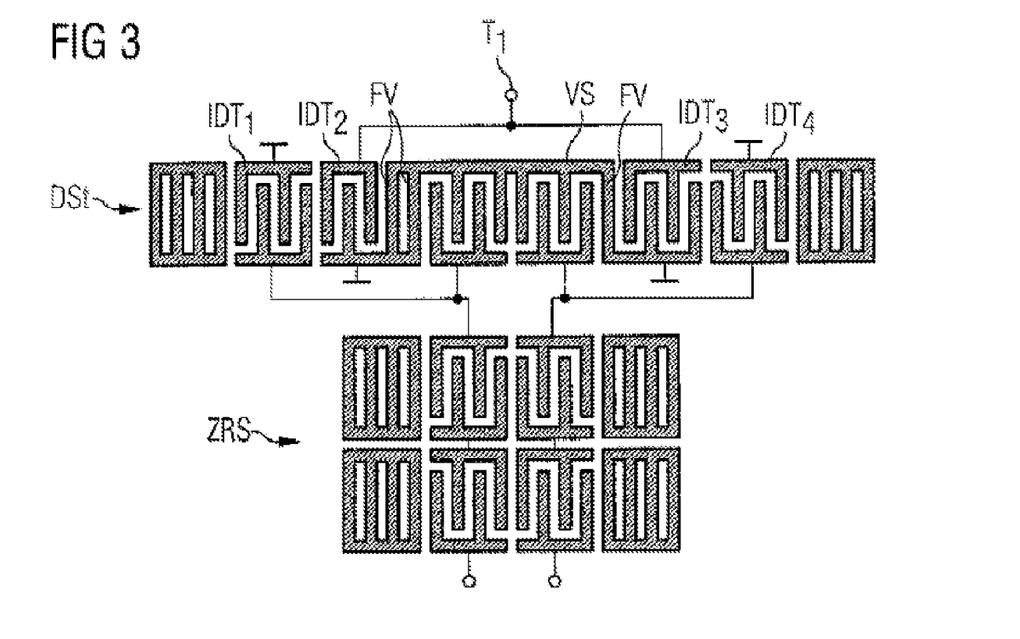
FIG. 3 shows a filter arrangement similar to FIG. 2, in which bus bars of adjacent interdigital converters of the DMS structure are connected via extended electrode fingers.

FIG. 3 shows another filter arrangement in which the DMS structure DSt also has a V-split converter VS arranged in the middle and four normal converters IDT1 to IDT4. In contrast to the arrangement according to FIG. 2, however, the outermost electrode fingers FV of the V-split converter VS are extended so long that they connect transversely via the acoustic tract to the opposing current bus of the adjacent interdigital converters IDT2 and IDT3. Because these two current buses each have a ground terminal, in this way, the non-divided upper current bus of the V-split converter VS is also connected to ground.

Figure 4:
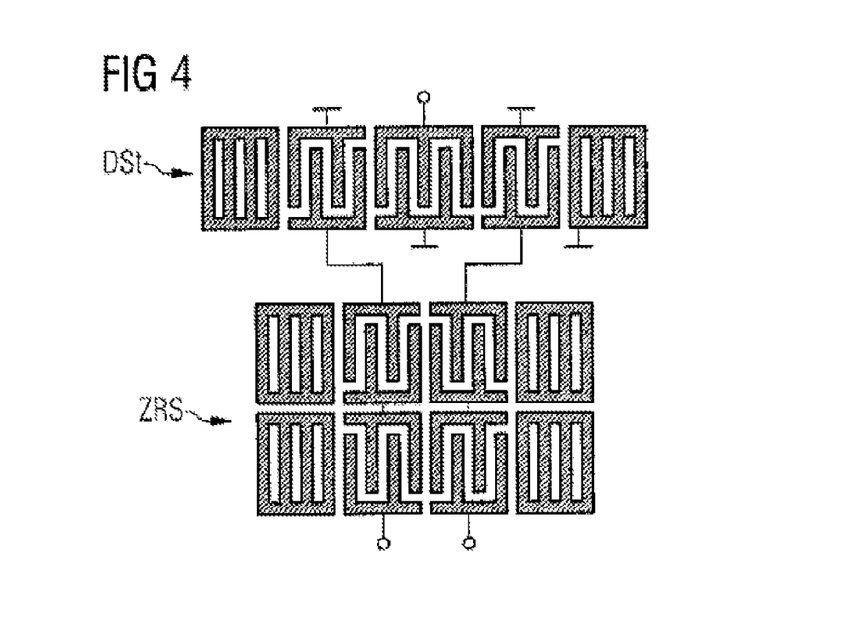
FIG. 4 shows a filter arrangement with a three-converter DMS structure and cascaded double-gate resonator.

FIG. 4 shows another filter arrangement in which the DMS structure DSt is made from only three interdigital converters, which are arranged between two reflectors. A cascaded double-gate resonator ZRS is connected in series to the outputs of the DMS structure DSt.

Figure 5:
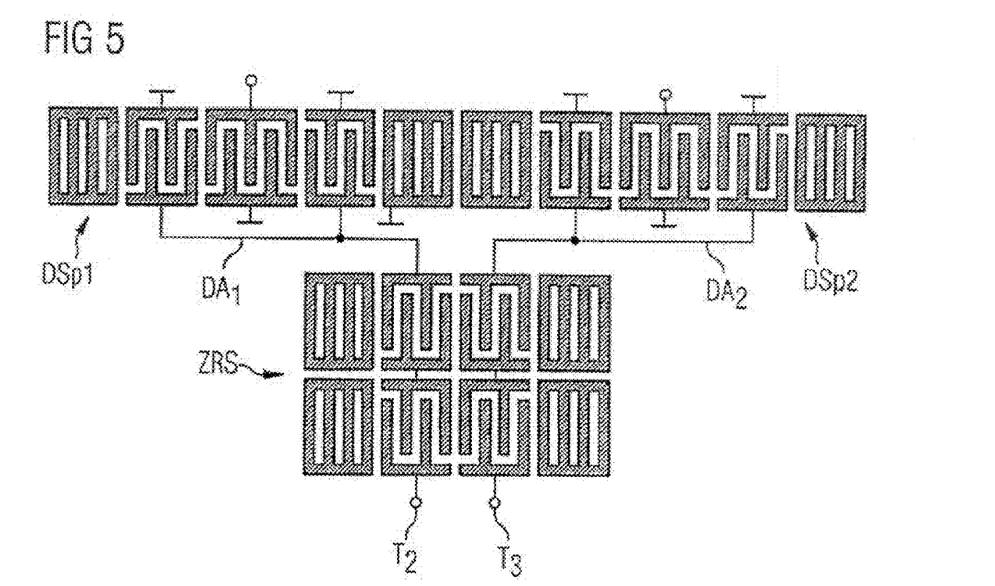
FIG. 5 shows an arrangement with two DMS tracks with a cascaded serial double-gate resonator.

FIG. 5 shows another filter arrangement in which the DMS structure has two acoustically decoupled DMS tracks DSP1, DSP2. Each of the DSP tracks DSP is a three-converter DMS track in which, on the output side, the lower current buses of the two outer interdigital converters in the DMS track are respectively interconnected in parallel. The two asymmetrical outputs of each DMS track are, however, symmetrical relative to each other, so that the DMS filter structure made from two DMS tracks has symmetrical terminals DA1, DA2 on the output side, which are connected in series via a cascaded double-gate resonator ZRS to the second gate of the filter arrangement.

The splitting of the DMS filter structure into two DMS filter tracks has the advantage that the two symmetrical outputs DA1, DA2 of the DMS filter structure cannot be mutually influenced and therefore can be optimized separately from each other, so that in the two terminals DA1, DA2, a signal with high symmetry can be obtained with respect to the signal amplitude and the phase.

Figure 6:
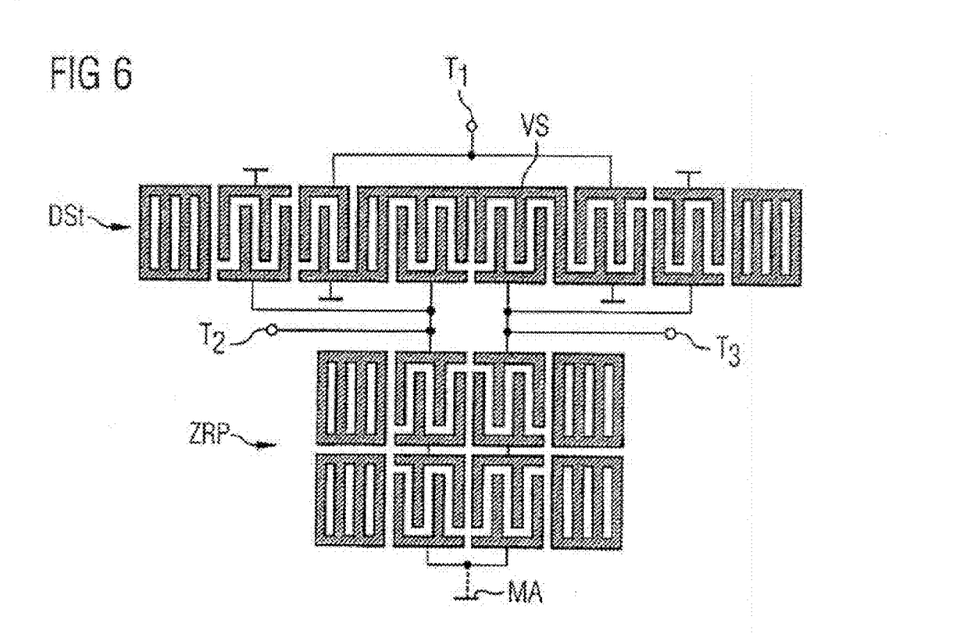
FIG. 6 shows a filter arrangement with a cascaded parallel double-gate resonator.

FIG. 6 shows another filter arrangement, in which a DMS structure DSt is connected between a first asymmetrical gate, which is formed by the signal terminal T1 and the corresponding ground terminals of the DMS structure, and a second symmetrical gate, which is formed by the terminals T2 and T3. A cascaded double-gate resonator ZRP is connected in parallel to the second gate and therefore also in parallel to the symmetrical output-side terminals of the DMS filter structure DSt. The two interdigital converters of the first (upper) cascade stage are connected to the second gate, while the two interdigital converters of the lower, second cascade stage are connected to each other on the output side and therefore connected in series. It is also possible to connect this connection selectively to a ground terminal MA. Furthermore, it is possible to connect the two interdigital converters of the second cascade stage to ground separately from each other.

A double-gate resonator connected in parallel to the symmetrical output of the DMS filter structure DSt has a resonance frequency that lies below the passband of the DMS filter structure DSt. Through the parallel connection of the resonator to ground, in this way a pole position is generated that corresponds to the resonance frequency of the parallel resonator and which creates a steeper left passband flank of the filter arrangement.

Figure 7:
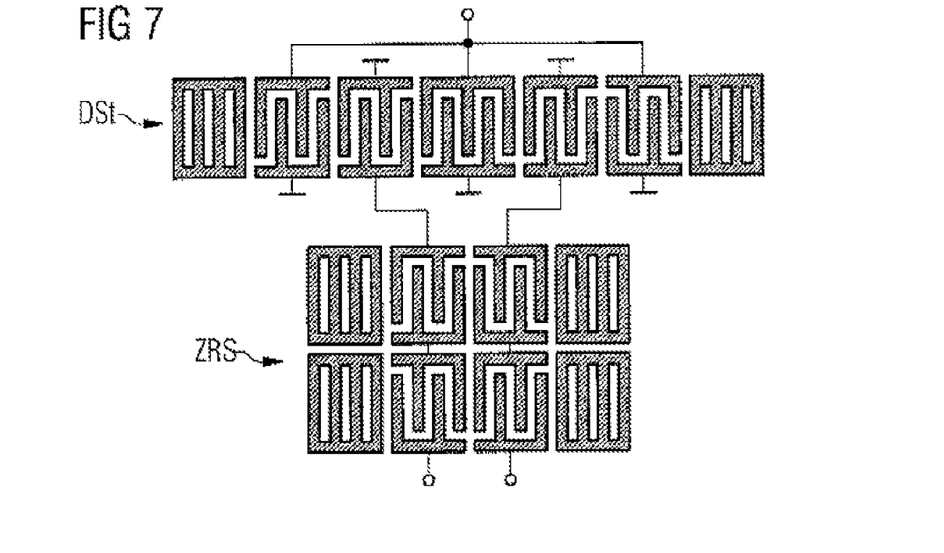
FIG. 7 shows a filter arrangement with a five-converter DMS structure and cascaded double-gate resonator.

FIG. 7 shows another embodiment, in which the DMS filter structure DSt is constructed as a five-converter DMS filter track, which has a symmetrical output. Here, the middle interdigital converter of the DMS filter structure DSt is constructed as a normal interdigital converter and not as a V-split converter. A cascaded double-gate resonator ZRS is connected in series between the DMS filter structure and the second gate.

Figure 8:
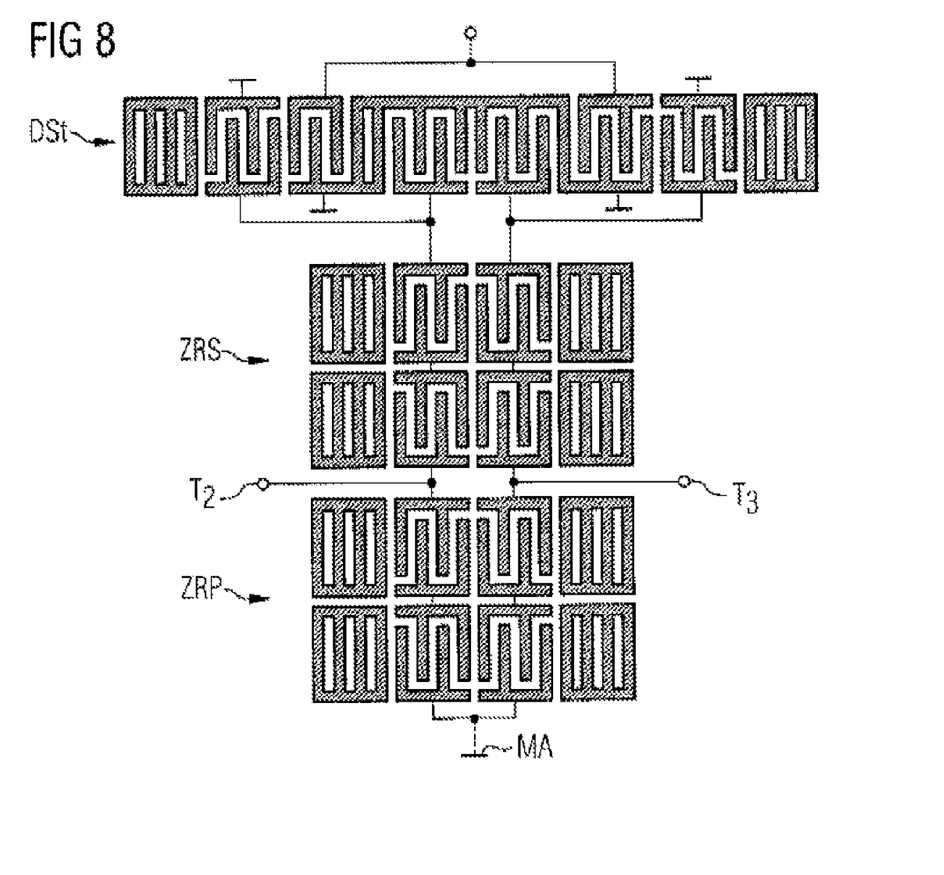
FIG. 8 shows a filter arrangement with a cascaded serial double-gate resonator and a cascaded parallel double-gate resonator.

FIG. 8 shows another variant of a filter arrangement according to the invention, in which a DMS filter structure DSt is connected in series with a first cascaded double-gate resonator ZRS and in parallel with a second cascaded double-gate resonator ZRP. Through a corresponding selection of the resonance frequencies of the cascaded resonators relative to the passband, which is formed by the DMS structure DSt, it is possible for both flanks of the passband to have a correspondingly steep shape. In addition, in this way it is possible to reduce the waviness of the passband itself relative to a corresponding filter arrangement under use of non-cascaded resonators. The parallel cascaded double-gate resonator ZRP can be connected on the output side again to a common ground terminal MA or serially in series with itself, without requiring a separate ground terminal.

Figure 9:
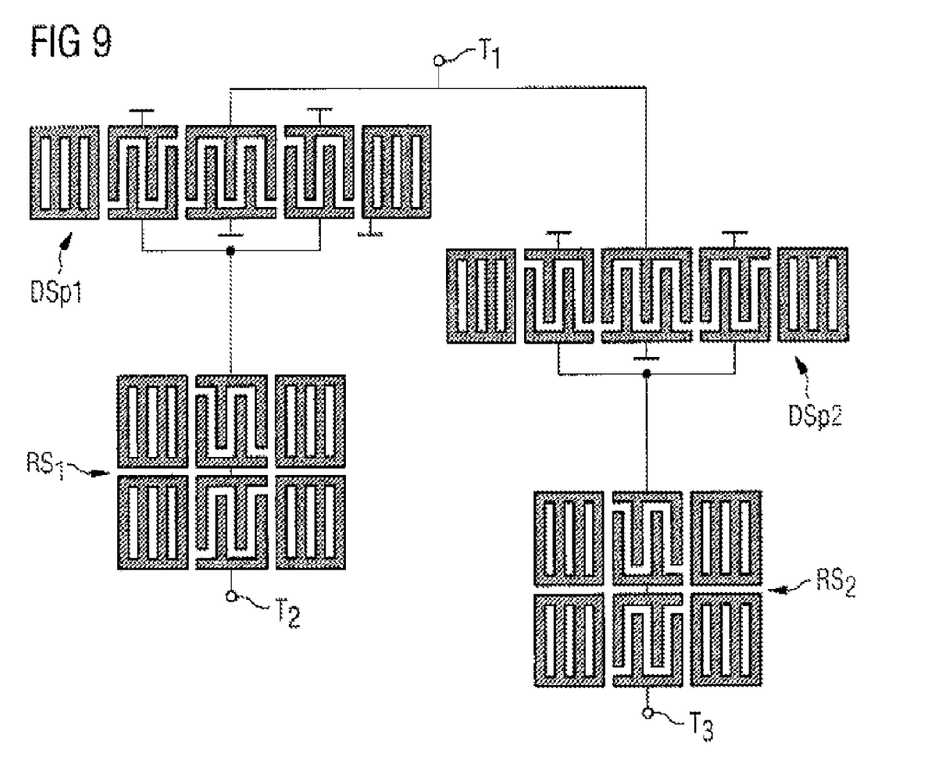
FIG. 9 shows a filter arrangement with two DMS tracks and two offset cascaded single-gate resonators.

FIG. 9 shows another embodiment, in which it is shown schematically that the DMS filter structure can be made from two DMS filter tracks DSP1, DSP2 independent of each other, which can be connected in series, in turn, on the output side, with cascaded single-gate resonators RS1, RS2 separated from each other. Here, it is possible to shift the acoustic tracks of all four elements relative to each other, so that even for poor acoustic termination of the individual tracks, no acoustic coupling between different acoustic tracks can occur. The advantage of good acoustic decoupling of the two halves of the filter arrangement according to the two symmetrical signal branches, however, is offset by the poorer symmetry of the conductor track guides, so that, in a real filter, the advantages and disadvantages must be weighed.

Figure 10:
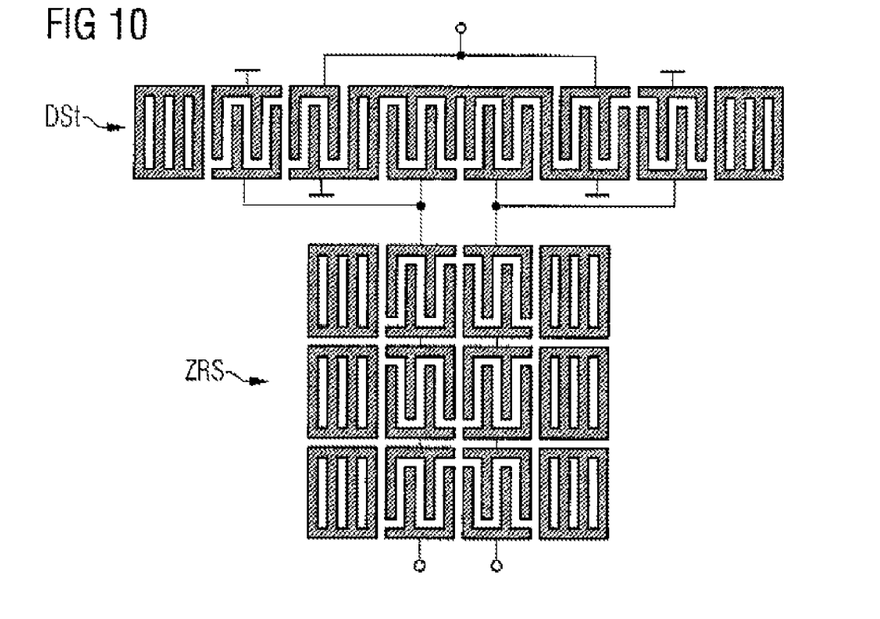
FIG. 10 shows a filter arrangement with a three-times cascaded serial resonator.

FIG. 10 shows another embodiment that is possible, in principle, in which the cascaded double-gate resonator ZRS, which is here connected in series to the DMS filter structure DSt, is constructed as a three-times cascade. Such a construction is especially resistant to power and can be produced with low capacitance and thus with especially strongly pronounced pole positions, without having to take into account transmission losses due to a number of electrode fingers that is too small or an aperture of the resonators that is too small. In principle, resonators connected in parallel can be cascaded to a higher degree.

In the ten different filter arrangements shown, different elements are connected with respect to the DMS filter structure to different cascaded resonators connected in series and in parallel. In addition to the shown combinations, however, it is also easily possible to exchange the shown elements with each other and thus to obtain additional construction variants. Thus, for example, each filter arrangement shown with only one resonator connected in series can be additionally provided with a parallel resonator. All of the filter arrangements connected with double-gate resonators can also be implemented with two single-gate resonators separated from each other. The DMS filter structures can be constructed with an arbitrarily, optionally higher or lower number of converters, without deviating from the idea forming the basis of the invention. In principle, each of the embodiments can be constructed with one or with two or more separate DMS filter tracks. In addition, additional single-gate resonators can be arranged on the asymmetrical gate in parallel to the gate or in series with the signal path.

Figure 11A:
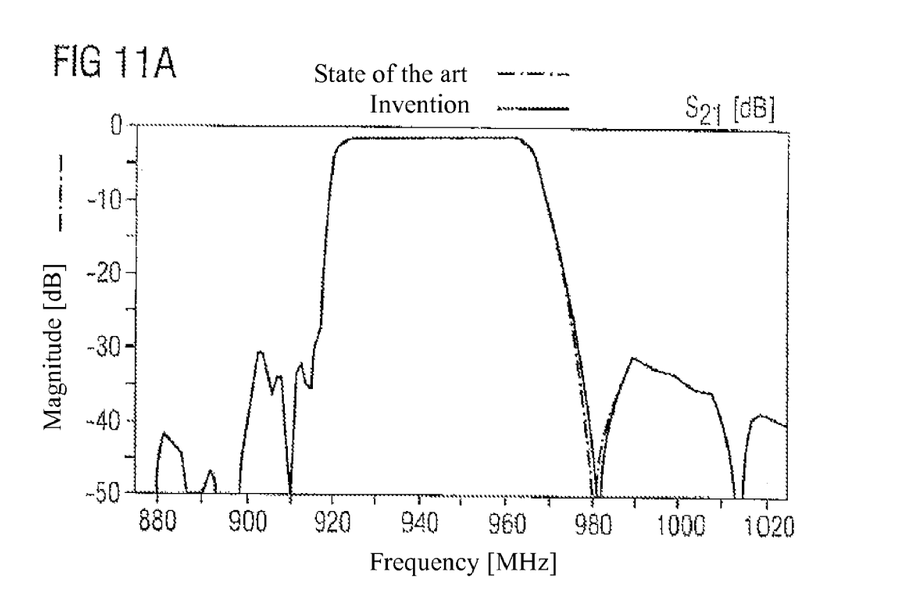
FIG. 11 shows the filter transmission curve of the filter shown in FIG. 3.
Figure 11B:
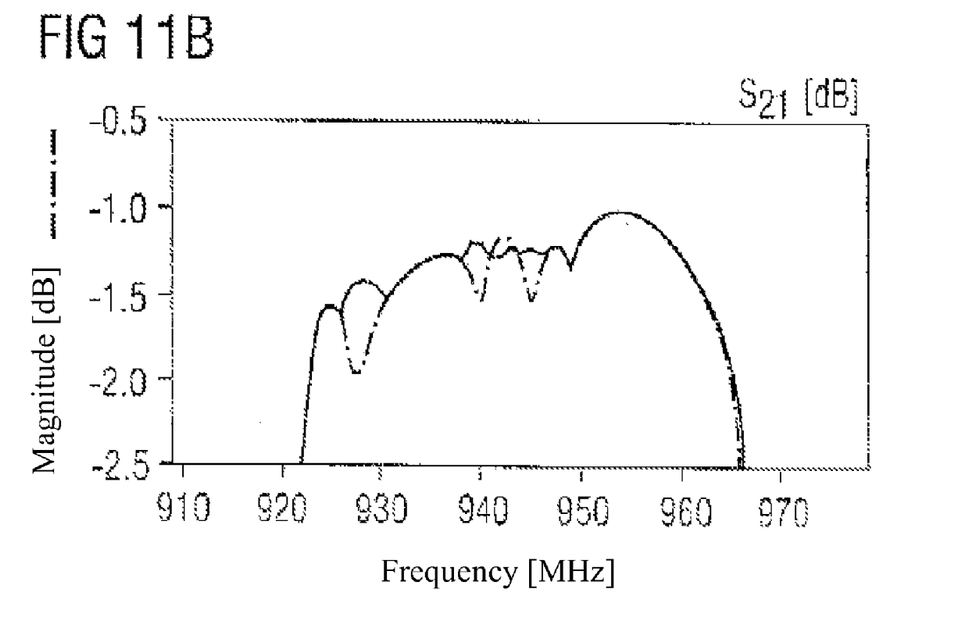
Figure 12:
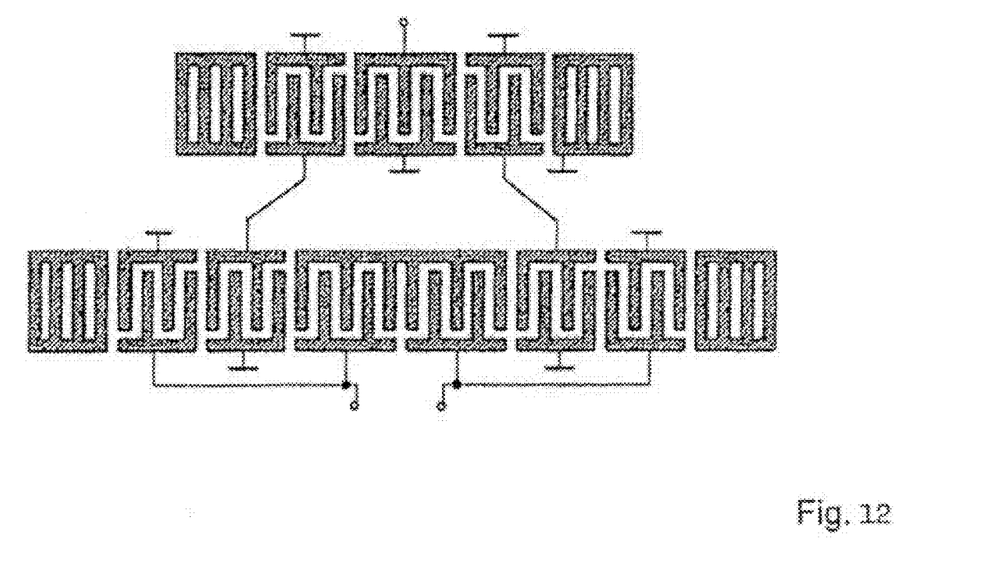
FIG. 12 shows a SMD filter structure comprising two SMS filter tracks connected in series.
Figure 13:
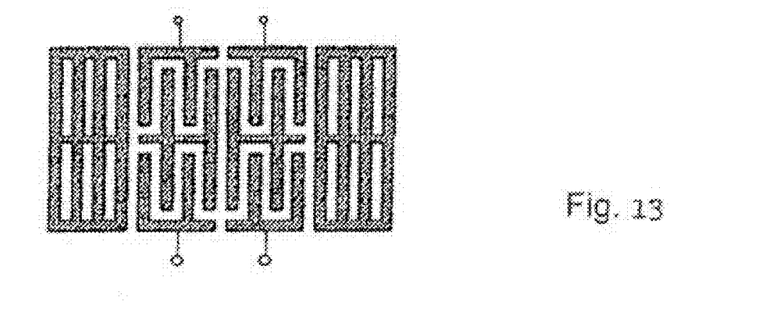
FIG. 13 shows a cascaded two-port resonator comprising a common middle current bus.

FIG. 11 shows the transmission curves of the filter arrangement shown in FIG. 3 in comparison with a filter arrangement known from the state of the art and which is constructed similar to FIG. 2, but wherein the cascaded double-gate resonator is replaced by a non-cascaded, simple series double-gate resonator. As follows from FIG. 11B, in which the passband is shown enlarged, with the resonated cascaded in series, in particular, the waviness in the transmission range is improved and thus the insertion attenuation is reduced.

The invention claimed is:

1. A surface acoustic wave (SAW) filter arrangement, comprising:
 a first gate configured to operate symmetrically or asymmetrically;
 a second gate configured to operate symmetrically;
 a double-mode surface acoustic wave (DMS) filter structure, comprising:
  an input connected to the first gate; and
  an output comprising a terminal pair that includes two symmetrical terminals configured to operate symmetrically, wherein
 each of the two symmetrical terminals of the terminal pair is electrically connected at the output of the DMS filter structure to a respective cascaded resonator, each cascaded resonator comprising a cascaded double-gate resonator that includes pair of resonators connected in series between the terminal pair on the output of the DMS filter structure and the second gate with the pair of resonators connected in series to the output of the DMS filter structure having a resonance frequency and the DMS filter structure having a transmission range having a middle end and an upper end, and the resonance frequency is between the middle end and the upper end of the transmission range.

2. The filter arrangement of claim 1, wherein at least one of the respective cascaded resonators is electrically connected to the second gate.

3. The filter arrangement of claim 1, wherein the DMS filter structure comprises two DMS filter tracks including a pair of inputs electrically connected to the first gate, each of the DMS filter tracks having an asymmetrical output, wherein the asymmetrical outputs form the two symmetrical terminals of the terminal pair on the output of the DMS filter structure that are electrically connected to the respective cascaded resonators.

4. The filter arrangement of claim 1, wherein the DMS filter structure comprises a middle converter configured as a V-split converter, wherein the V-split converter is symmetrical to a reflection plane and includes a divided current bus configured to operate symmetrically having two halves that points toward the second gate.

5. The filter arrangement of claim 4, wherein the V-split converter comprises a continuous current bus electrically connected at least on one side via extended electrode fingers to an opposite current bus of an adjacent converter, the opposite current bus being electrically connected to a ground terminal.

6. The filter arrangement of claim 1, wherein each cascaded resonator in the pair of resonators comprises one or more converters arranged in tight spatial vicinity of each other.

7. The filter arrangement of claim 6, wherein two adjacent converters of at least one of the cascaded resonators in the pair of resonators are symmetrical to a reflection plane, the reflection plane being perpendicular to one or more electrode fingers of each of the two adjacent converters.

8. The filter of claim 1, wherein the DMS filter structure comprises two DMS filter tracks connected in series.

9. The filter arrangement of claim 1, wherein each of the cascaded resonators in the pair of cascaded resonators comprise one or more converters having a common middle current bus.

10. The filter arrangement of claim 9, wherein two adjacent converters of at least one of the cascaded resonators in the pair of resonators are symmetrical to a reflection plane, the reflection plane passing through the common middle current bus.

11. The filter arrangement of claim 1, wherein each of the cascaded resonators comprises a pair of resonators and each of the two symmetrical terminals is electrically connected to a first resonator in a respective one of the cascaded resonators.

12. A surface acoustic wave (SAW) filter arrangement, comprising:
   a first gate configured to operate symmetrically or asymmetrically;
   a second gate configured to operate symmetrically;
   a double-mode surface acoustic wave (DMS) filter structure, comprising:
      an input connected to the first gate; and
      an output comprising a terminal pair that includes two symmetrical terminals configured to operate symmetrically, wherein
      each of the two symmetrical terminals of the terminal pair is electrically connected at the output of the DMS filter structure to a respective cascaded resonator;
   wherein each cascaded resonator comprises a pair of resonators connected in parallel to the terminal pair on the output of the DMS filter structure and in parallel to the second gate;
   wherein the pair of resonators connected in parallel to the output of the DMS filter structure have a resonance frequency, the DMS filter structure has a transmission range including a passband, and the resonance frequency is below the transmission range near a low flank of the passband; and
   wherein each cascaded resonator in the pair of resonators is a cascaded double-gate resonator.

13. The filter arrangement of claim 12, wherein each cascaded resonator in the pair of resonators comprises a plurality of resonators constructed as two-times cascades of the cascaded double-gate resonators.

14. The filter arrangement of claim 12, wherein the cascaded double-gate resonator comprises a plurality of resonators, each of the plurality of resonators is symmetrical with respect to a reflection plane.

\* \* \* \* \*